(12) United States Patent
Flores et al.

(10) Patent No.: US 11,703,764 B2
(45) Date of Patent: Jul. 18, 2023

(54) FABRICATION OF HIGH-ASPECT RATIO NANOSTRUCTURES BY LOCALIZED NANOSPALLING EFFECT

(71) Applicant: Khalifa University of Science and Technology, Abu Dhabi (AE)

(72) Inventors: Raquel Flores, Abu Dhabi (AE); Ricardo Janeiro, Abu Dhabi (AE); Jaime Viegas, Abu Dhabi (AE)

(73) Assignee: Khalifa University of Science and Technology, Abu Dhabi (AE)

( * ) Notice: Subject to any disclaimer, the term of this patent is extended or adjusted under 35 U.S.C. 154(b) by 0 days.

(21) Appl. No.: 17/485,065

(22) Filed: Sep. 24, 2021

(65) Prior Publication Data

US 2022/0100093 A1 Mar. 31, 2022

Related U.S. Application Data

(60) Provisional application No. 63/087,101, filed on Oct. 2, 2020, provisional application No. 63/083,581, filed on Sep. 25, 2020.

(51) Int. Cl.
| | |
|---|---|
| *G03F 7/20* | (2006.01) |
| *H01L 21/311* | (2006.01) |
| *H01L 21/3065* | (2006.01) |
| *H01L 21/308* | (2006.01) |
| *H01L 21/033* | (2006.01) |
| *H01L 21/027* | (2006.01) |

(52) U.S. Cl.
CPC ........ *G03F 7/2004* (2013.01); *H01L 21/0279* (2013.01); *H01L 21/0337* (2013.01); *H01L 21/308* (2013.01); *H01L 21/3065* (2013.01); *H01L 21/31116* (2013.01); *H01L 21/31144* (2013.01)

(58) Field of Classification Search
None
See application file for complete search history.

(56) References Cited

U.S. PATENT DOCUMENTS 6,703,190 B2 * 3/2004 Elian ................. G03F 7/039
430/326
9,627,221 B1 * 4/2017 Zaitsu ............... H01L 21/02211

OTHER PUBLICATIONS

Bedell et al., "Kerf-Less Removal of Si, Ge, and III-V Layers by Controlled Spalling to Enable Low-Cost PV Technologies", IEEE Journal of Photovoltaics, vol. 2, No. 2, Apr. 2012, pp. 141-147.
Cadarso et al., "High-Aspect-Ratio Nanoimprint Process Chains", Microsystems & Nanoengineering, vol. 3, No. 17017, Jul. 17, 2017, 12 pages.

(Continued)

*Primary Examiner* — Stephanie P Duclair
(74) *Attorney, Agent, or Firm* — Kilpatrick Townsend & Stockton LLP (57) ABSTRACT

In this work is presented a method for fabrication of high-aspect ratio structures through spalling effect. The spalling is achieved through lithography, etching and sputtering processes, thus providing the flexibility to position the spalled structures according to the application requirements. This method has been successfully demonstrated for metal-oxides and metals. The width of the fabricated structures is dependent on the thickness of the film deposited by sputtering, where structures as small as 20 nm in width have been obtained.

17 Claims, 5 Drawing Sheets

(56) References Cited

OTHER PUBLICATIONS

He et al., "Flexible Heterogeneous Integration of PZT Film by Controlled Spalling Technology", Journal of Alloys and Compounds, vol. 807, Oct. 30, 2019, p. 151696.
Ovsianikov et al., "Three-dimensional Photofabrication with Femtosecond Lasers for Applications in Photonics and Biomedicine", Applied Surface Science, vol. 253, No. 15, May 2007, pp. 6599-6602.
Pruessner et al., "Cryogenic Etch Process Development for Profile Control of High Aspect-ratio Submicron Silicon Trenches", Journal of Vacuum Science & Technology B: Microelectronics and Nanometer Structures Processing, Measurement, and Phenomena, vol. 25, No. 1, Jan.-Feb. 2007, pp. 21-28.

\* cited by examiner

FABRICATION OF HIGH-ASPECT RATIO NANOSTRUCTURES BY LOCALIZED NANOSPALLING EFFECT

CROSS REFERENCE TO RELATED APPLICATIONS

This application claims the benefit of and priority to U.S. Provisional Application No. 63/087,101 filed on Oct. 2, 2020 and titled "METHOD FOR FABRICATION OF HIGH-ASPECT RATIO NANOSTRUCTURES BY LOCALIZED NANOSPALLING EFFECT," and U.S. Provisional Application No. 63/083,581 filed on Sep. 25, 2020 and titled "METHOD FOR FABRICATION OF HIGH-ASPECT RATIO NANOSTRUCTURES BY LOCALIZED NANOSPALLING EFFECT," the contents of both of which are herein incorporated by reference in their entireties for all purposes.

BACKGROUND

Electronics can use nanostructures with high surface area to volume ratio structures. These electronics can be used in various systems including in systems for energy storage, energy conversion, or where high surface area to volume ratio is desired. However, manufacturing and positioning these nanostructures can be difficult. Manufacturing techniques can include subtractive patterning, additive patterning, and molding techniques. However, these manufacturing techniques use high-resolution lithography or cryogenic temperatures which have low manufacturing throughput and poor replication.

BRIEF DESCRIPTION OF THE DRAWINGS

Various embodiments in accordance with the present disclosure will be described with reference to the drawings, in which.

DETAILED DESCRIPTION

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

High-ratio structures, especially with sub-micron features, pose a big challenge to fabrication processes. In order to achieve high-ratio structures, complex and intricate processes need to be employed. The typical fabrication processes can be grouped in three main approaches: subtractive patterning (e.g. etching), additive patterning (e.g. three-dimensional photofabrication), and molding techniques (e.g. nanoimprint). However, these techniques have disadvantages such as requiring extremely high-resolution lithography or cryogenic temperatures, presenting low manufacturing throughput, and poor replication.

Embodiments and techniques described herein are directed to systems and methods for fabrication of self-assembly of 3D structures. The method can include the partial/selective peeling off of nanometer-thick layer materials following a lithography, reactive ion etch step and thin film deposition, forming nanometer-scale thickness walls which can have lengths ranging from a few nanometers to hundreds of micrometers.

The process can include a UV lithography performed on a photoresist. For example, the photoresist can be or include a photoresist (e.g., a positive photoresist comprised of a novolak resin and naphthoquinone dyazide photoactive compound). In various embodiments, the photoresist can be or include an AZ5214E photoresist The AZ5214E photoresist is capable of image reversal due to a special crosslinking agent that becomes active above 110° C. in previously exposed areas. Thus the lithography is a two steps process, comprising a first lithography to define the features of interest and a second flood exposure aimed at inducing the image reversal of the resist. The first lithography can include selectively exposing the photoresist to ultraviolet light. The second flood expose can include exposing the photoresist, with no selective area, to a second UV exposure. In various embodiments, the lithography step can be carried out by a direct writer laser tool, and the flood exposure can be completed using an Ultraviolet flood exposure, for example, a SUSS MA8/BA8e mask aligner.

The lithography can be followed by a reactive ion etch, for example, performed using a Reactive Ion Etching (RIE) plasma tool. Formation of the nano-walls can include the integration of the photoresist removal stage as the last step of the etching recipe. The photoresist removal stage can include using an $O_2$ plasma for the removal of the photoresist. After etching, a deposition of a material of interest can be deposited by physical vapor deposition methods such as sputtering.

The process of self-assembly of 3D structures can be used for several materials, such as molybdenum-doped indium oxide, tungsten trioxide, vanadium dioxide and silver. The process can additionally or alternatively be used with multilayered films deposited by plasma sputtering, where the self-assembled structures are composed by vertical stacks of the deposited materials. In addition, the self-assembly of 3D structures was also successfully demonstrated for nano-scale structures (e.g., structures as small as 100 nm) based on electron-beam lithography.

The devised method proved to be extremely versatile with possible applications over a wide range of fields, given that different materials can be used with this technique, ranging from sensors, batteries, catalytic, and electrochemical applications.

Embodiments described herein include systems and techniques that can be used to solve long-standing problems in the field on nanotechnology. For example, how to achieve high-aspect ratio free standing nanostructures and how to accurately position these nanostructures in organized patterns following a design layout. Embodiments described herein are directed to, for example, a method based on spalling effect for the creation of self-assembled 3D structures. Spalling effect is a mechanism consisting on the peeling-off of a flexible layer, requiring the presence of a stressor layer underneath. The basic physical mechanism underlying spalling effect lies in the fact that in the presence of a surface film under residual tension, the strain mismatch generates a sufficient energy release rate.

In various embodiments, a stressor layer can be selectively created on the surface of the sample by lithography and etching processes, thus enabling to deliberate choose the location and patterns of the self-assembled nanostructures.

The fabrication process described herein allows the formation of self-assembled nano-walls with high aspect ratio. This technique is based on spalling effect by a thin stressor layer created by reactive ion etch of a photoresist film. The self-assembly process can be used for several materials, including metal and metal-oxides.

Figure 1:
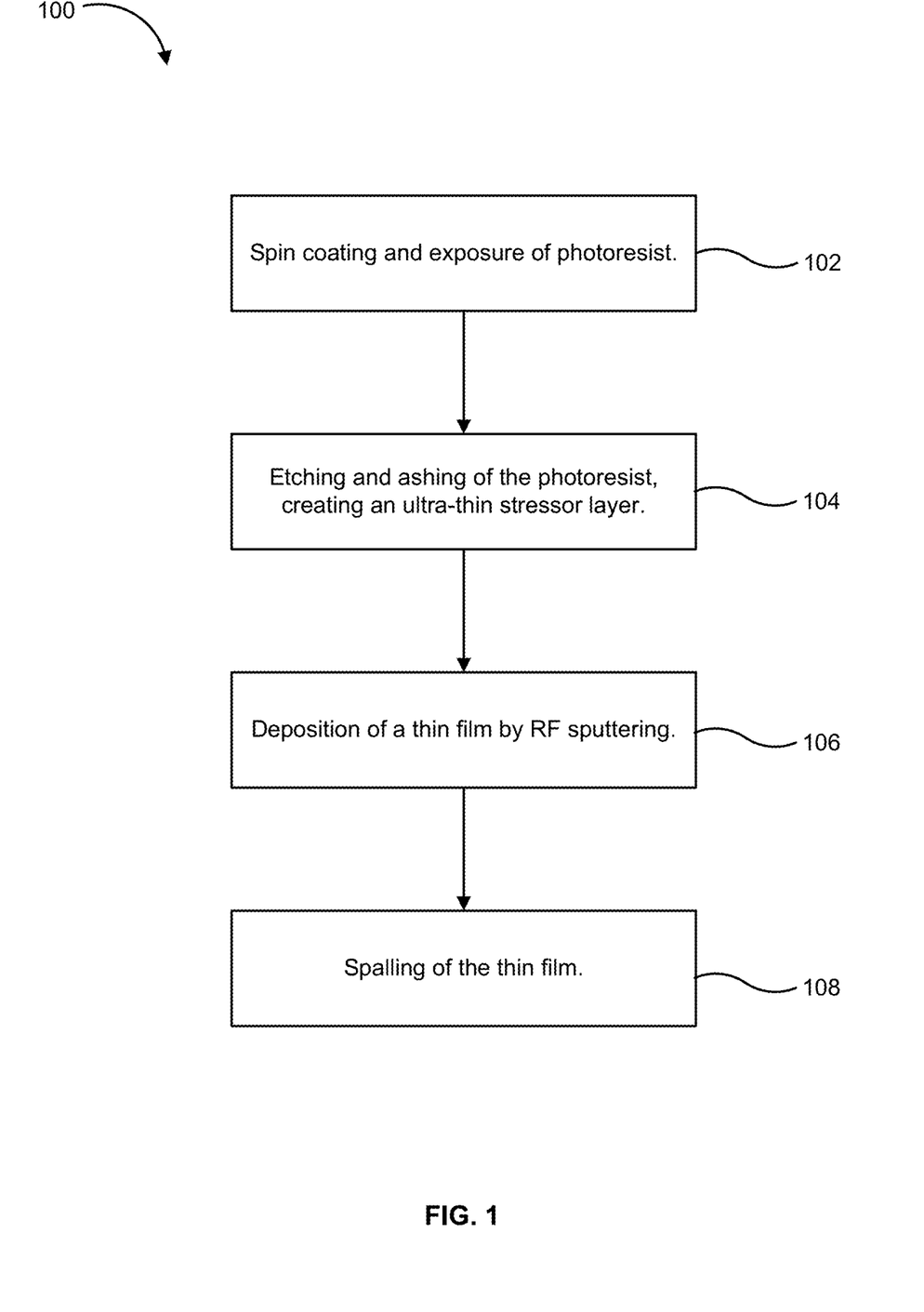
FIG. 1 illustrates a process for fabrication of high-aspect ratio structures through spalling effect, according to various embodiments.
Figure 2A:
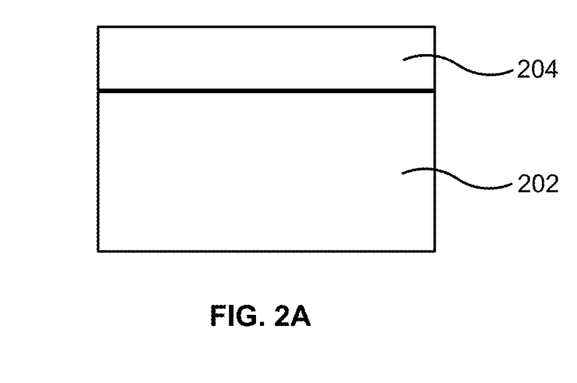
FIGS. 2A, 2B, 2C, and 2D illustrate various states of components that may be implemented in a simplified process for fabrication of high-aspect ratio structures through spalling effect, according to various embodiments.
Figure 2B:
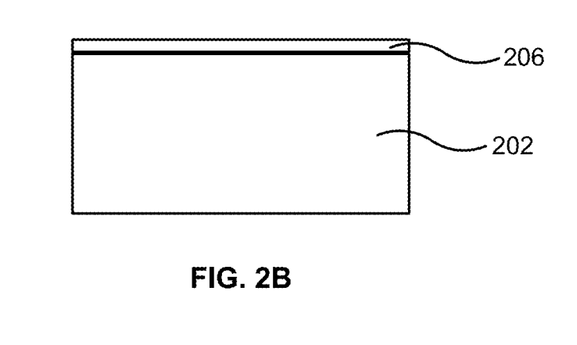
Figure 2C:
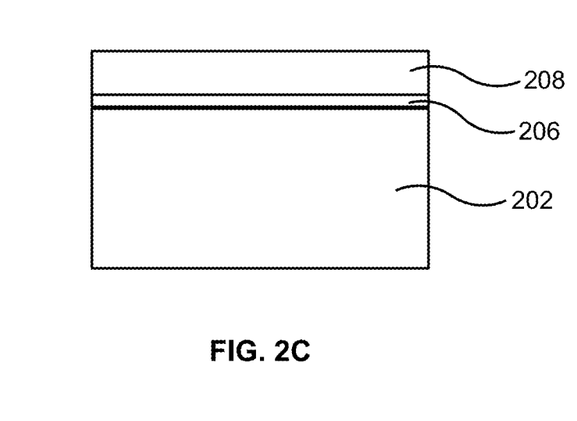
Figure 2D:
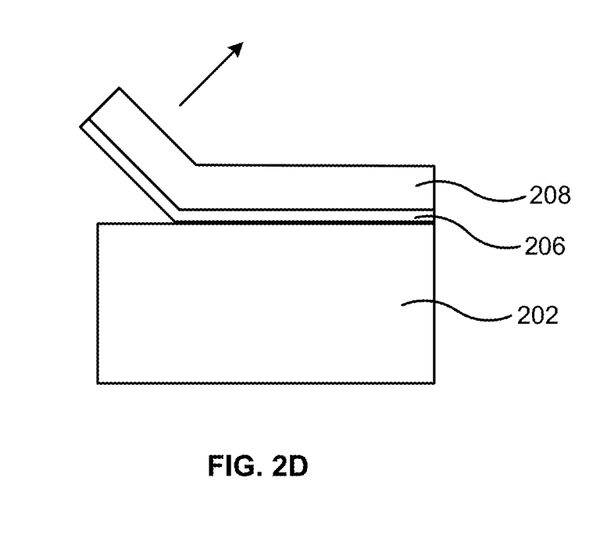
Figure 3A:
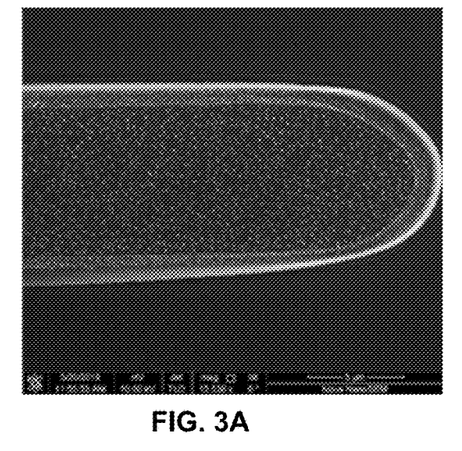
FIGS. 3A, 3B, 3C, and 3D show examples of self-assembled nanowalls obtained by spalling effect, according to various embodiments.
Figure 3B:
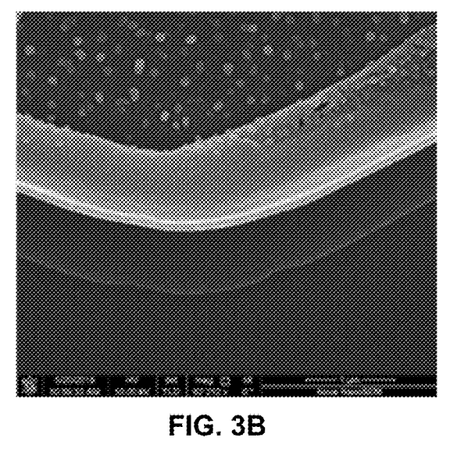
Figure 3C:
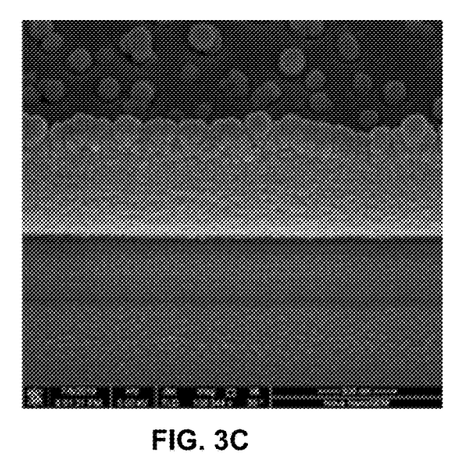
Figure 3D:
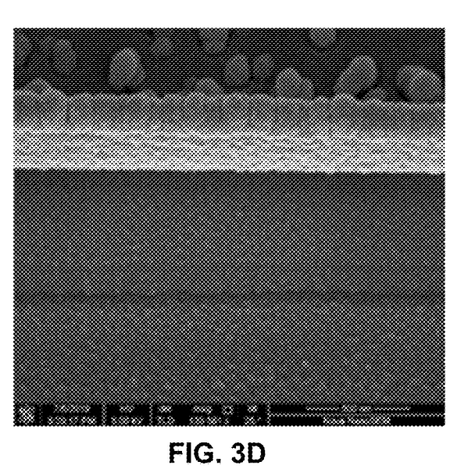

Turning now to the figures, FIG. 1 illustrates a process 100 for the self-assembly of nanowalls. The process 100 is based on the spalling (i.e., a selective peeling-off of nanometric thin films following a lithography, a reactive ion etch and a thin film deposition steps) forming nano-walls along lines of micrometric length. The process 100 at step 102 can include a UV lithography of a photoresist 204 (e.g., a AZ5214E photoresist) which is spin coated on a clean substrate 202 (e.g., as shown in FIG. 2A). The process 100 at step 104 can include a reactive ion etching and ashing of the exposed photoresist 204, creating an ultra-thin layer of a carbon residue 206 on the areas where the photoresist was located (e.g., as shown in FIG. 2B). The process 100 at step 106 can include deposition of a thin film 208, smaller than 100 nm-thick, by RF sputtering (e.g., as shown in FIG. 2C). The process 100 at step 108 can include spalling of the thin film 208. In various embodiments, the carbon layer 206 can act as a tensor, leading to the spalling of the thin film 208 around the edges of the patterned features (e.g., as shown in FIG. 2D). As a result, 3D nanowalls are self-assembled along the edges of the previously patterned structures, where the thickness of the nanowalls is controlled by the thickness of the film deposited by sputtering.

2.2. Lithography

The process 100 at step 102 can include a UV lithography performed on an a photoresist. For example, an AZ5214E photoresist which can include a novolak resin and naphthoquinone dyazide photoactive compound. The photoresist can be capable of image reversal due to a special crosslinking agent that becomes active above 110° C. in previously exposed areas. Thus, this lithography is a two steps process, comprising a first lithography to define the features of interest and a second flood exposure aimed at inducing the image reversal of the resist. The exposure step can use a direct writing laser tool. The specific parameters of the lithography can be or include:

1. Spin coating: 10 s @ 500 rpm/60 s @ 3000 rpm/10 s @ 500 rpm;
2. Baking: 1 min @ 110° C.;
3. Exposure: with a direct laser writer (Dilase 250), at a wavelength of 375 nm;
4. Dwell time before post-baking: 2 min to avoid bubble capture;
5. Post-baking: 2 min @ 130° C.;
6. Flood exposure: with an UV mask-aligner, with a dose of 400 mJ/cm2;
7. Developing: 20 s to 40 s in AZ326.

2.3. Etching and Ashing

The lithography is followed by a reactive ion etch performed in a RIE tool, crucial to the formation of the nano-walls. The last step of the etching recipe is the integration of the photoresist ashing by an $O_2$ plasma cleaning. In various embodiments, the etching and ashing can be or include one or more of the parameters shown in Table 1.

TABLE 1

Etching and ashing process steps and respective parameters

| Step | T (min) | O2 (sccm) | CF4 (sccm) | Ar (sccm) | Bias (W) | ICP (W) | P (Pa) |
|---|---|---|---|---|---|---|---|
| Etch | 6 | 0 | 10 | 90 | 50 | 150 | 1.33 |
| Ashing 01 | 2 | 100 | 0 | 0 | 50 | 400 | 1.00 |
| Ashing 02 | 10 | 100 | 0 | 0 | 50 | 400 | 5.00 |
| Ashing 03 | 1 | 100 | 0 | 0 | 50 | 0 | 1.00 |

2.4. RF Sputtering Deposition

After the ashing, the process 100 can include a thin film deposition by RF sputter deposition. In various embodiments, the sputter deposition can be performed using various tools (e.g., sputtering tools). Example tools include an AJA Orion 8 UHV sputttering tool. The thin film can be or include molybdenum-doped indium oxide, vanadium oxide, tungsten trioxide, and/or silver. The deposition parameters are displayed in Table 2. The process can be used with one, some, or all of the different materials shown.

TABLE 2

RF sputtering deposition materials and respective deposition parameters.

| Material | O2 (sccm) | Ar (sccm) | RF (W) | Working Pressure (mTorr) |
|---|---|---|---|---|
| Molybdenum-doped Indium Oxide, IMO | 0.2 | 65 | 50 | 5.0 |
| Vanadium Oxide, $VO_2$ | 0.0 | 65 | 100 | 5.0 |
| Tungsten trioxide, $WO_3$ | 0.0 | 65 | 200 | 5.0 |
| Silver, Ag | 0.0 | 25 | 70 | 5.0 |

Turning to FIGS. 3A through 3D, 3D self-assembled nanowalls obtained by spalling effect are shown. FIGS. 3A through 3D shows images of the self-assembled nanowalls through scanning electron microscope (SEM).

3.1. Influence of the Etching and Ashing Steps

In an illustrative example, variations were introduced to the standard etching and ashing steps. The summary of the different processes is shown in Table 3. The samples were deposited on a thin film of $WO_3$ by RF sputtering.

Run #1 was fabricated using the standard process, which resulted in the positive formation of the nanostructures as reported above. For run #2, the photoresist was removed by ashing, without undergoing the etching step, and there was no evidence of spalling of the thin film. The etching step is fundamental for the creation of a thin stressor layer which is required for the spalling mechanism to take place. The reactive ion etching leads to the localized overheating of the photoresist, creating a thin layer of carbonized resist which is not removed by the $O_2$ ashing. When the photoresist was stripped by acetone prior to the etching in run #3, the nanowalls were not created. And likewise, when run #4 was cleaned by an acetone bath after the ashing step, no formation of nanostructures was seen on the sample. These results demonstrate that the self-assembly of the nanostructures is due to the existence of a thin residue that is left on the surface of the sample, which acts a stressor leading to the spalling of the films. Whereas when the residue is removed by acetone, there is no formation of the structures, i.e., no spalling effect. The legend for Table 3 below is: "O"—process step was carried out; "X"—process step was skipped, "+"—the formation of the nanostructures was successful, "−"—the formation of the nanostructures was not successful.

TABLE 3

Influence of the etching and ashing steps on the growth of the nanowalls.

| Run | Lithography | Acetone clean (before) | Etch | Ashing 01 | Ashing 02 | Ashing 03 | Acetone clean (after) | RF sputtering | Result |
|---|---|---|---|---|---|---|---|---|---|
| #1 | O | X | O | O | O | O | X | O | + |
| #2 | O | X | X | O | O | O | X | O | − |
| #3 | O | X | O | O | O | O | O | O | − |
| #4 | O | O | O | O | O | O | X | O | − |

3.2 Raman Spectroscopy

To verify the presence of the thin film residue and its composition, samples can be subjected to a Raman spectroscopic analysis. The Raman mapping was performed on a sample that underwent lithography, etching, and ashing, but no thin film deposition by sputtering.

Figure 4A:
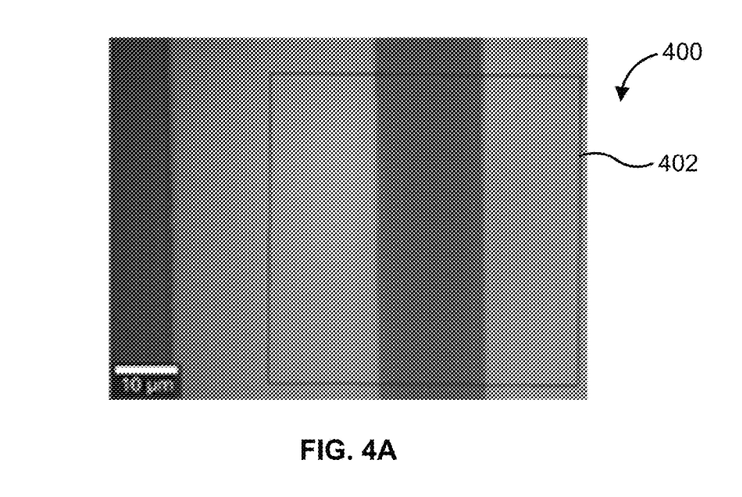
FIG. 4A shows an optical microscope image of an example etched sample, according to various embodiments.
Figure 4B:
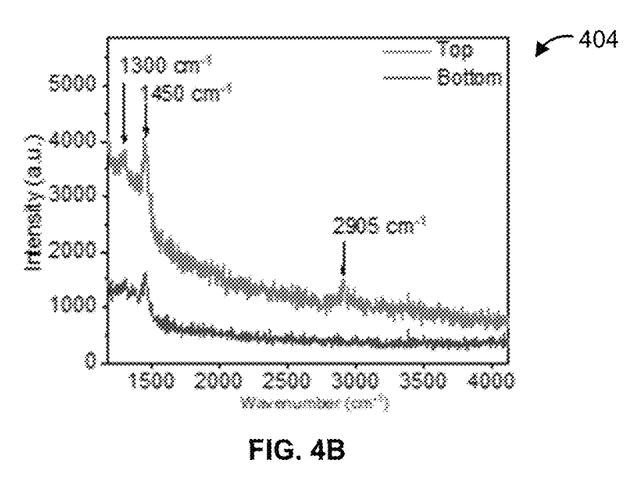
FIG. 4B shows a graph that shows the Raman spectra, according to various embodiments.
Figure 4C:
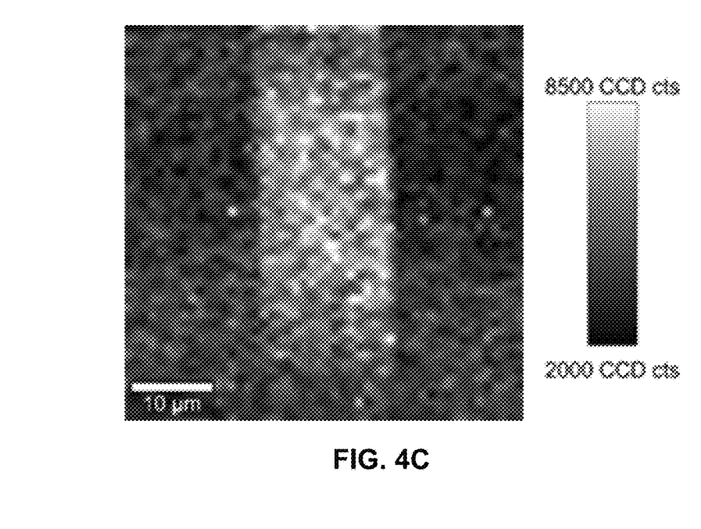
FIGS. 4C and 4D show Raman mapping at various wavenumbers, according to various embodiments.
Figure 4D:
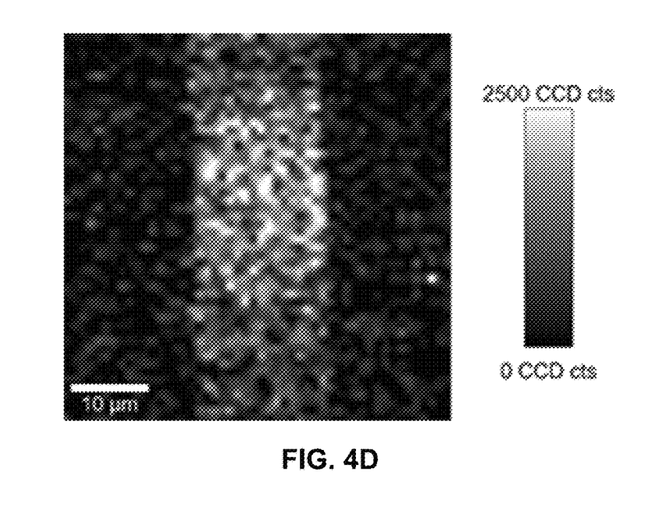

FIG. 4A shows an optical microscope image of an etched sample 400 with the square 402 signifying the Raman analysis area. FIG. 4B shows a graph 404 that shows the Raman spectra. FIGS. 4C and 4D show the Raman mapping at wavenumbers of 1450 cm$^-$ and 2905 cm$^{-1}$, respectively. The measurements were conducted with an excitation wavelength of 533 nm, integration time of 20 s, using the enhanced gain CCD mode measurement, and the obtained spectra are presented in FIG. 4B. The Raman map in FIG. 4D shows that there is a carbon residue, at a wavenumber of 2905 cm$^{-1}$, left on the surface of the sample wherein the photoresist was located prior to the etching and ashing steps. This carbon film is not present elsewhere in the surface of the sample, thus corroborating the proposed spalling mechanism.

3.3 Effect of the Substrate Material

In various embodiments, different substrate materials can be used. The substrate materials can have different effects on the formation of the 3D structures. The different substrates that have been used are shown in Table 4. The self-assembly of the 3D structures was successful for all substrates except for bare silicon, which indicates the adhesion of the stressor layer to the silicon, in comparison with the different oxides, is stronger preventing the spalling effect from taking place.

TABLE 4

Substrates materials and the corresponding result on the self-assembly of the 3D structures, where "+" denotes a successful formation of the structures and "−" denotes no formation.

| Substrate material | Si | Si/SiO$_2$ | Si/SiO$_2$/HfO$_2$ | Si/SiO$_2$/TiO$_2$ |
|---|---|---|---|---|
| Self-assembly process | − | + | + | + |

3.4. Width Control of the Nanowalls and Bilayer Fabrication

Figure 5A:
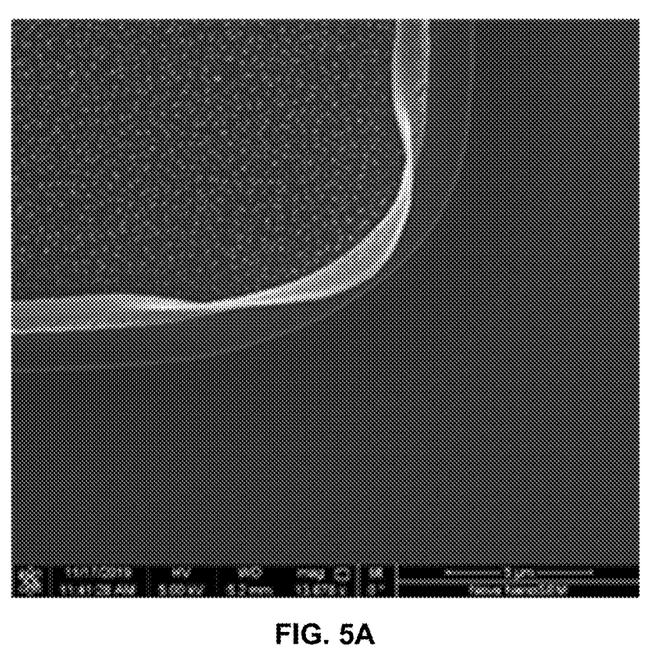
FIGS. 5A and 5B show example nanowalls, according to various embodiments.
Figure 5B:
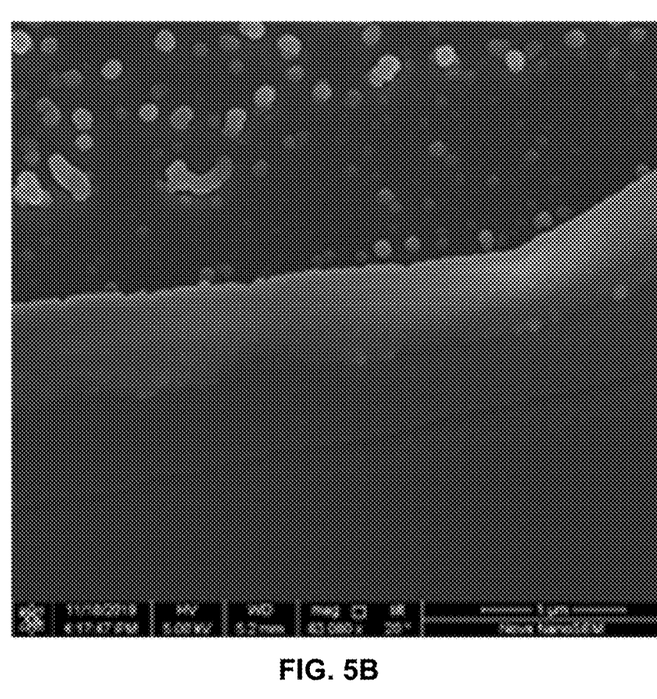

FIG. 5A shows a 20 nm-wide nanowall of WO$_3$ and FIG. 5B shows a nanowall constituted by a bilayer of WO$_3$ and VO$_2$. The width of the spalled nanowalls is the thickness of the film deposited through sputtering, as such the width can be controlled by regulating the deposition parameter, namely the deposition times. Structures as small as 20 nm in width have been obtained. An SEM image of 20 nm-wide nanowall of WO$_3$ is presented in FIG. 5A.

The systems and methods described herein offer the possibility of creating vertical walls composed by multiple materials, which opens the doors to a wide variety of possible applications. Two sequential RF sputtering depositions were conducted on the same sample, one of WO$_3$ and the other of VO$_2$. The result is vertical bilayer composed by the two materials, with a total width given by the sum of the widths of both films. An SEM image is shown in FIG. 5B.

Based on the disclosure and teachings provided herein, a person of ordinary skill in the art will appreciate other ways and/or methods to implement the various embodiments. The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A method for fabrication of high-aspect ratio structures, the method comprising:
   exposing, using ultraviolet light, a portion of a sample including photoresist, the sample positioned on a substrate and the photoresist comprising a photoactive compound;
   etching, using reactive ion etching, the portion of the sample without photoresist;
   ashing, using plasma cleaning, the exposed portion of the photoresist, the ashing replacing exposed portion of the photoresist with carbon residue; and
   depositing, using RF sputter deposition, a thin film on the carbon residue.

2. The method of claim 1, wherein the depositing of the thin film on the carbon residue causes spalling of the thin film.

3. The method of claim 1, wherein the exposing of the portion of the photoresist comprises:
   spin coating the substrate with the photoresist;
   exposing the photoresist to a direct laser writer; and
   exposing the photoresist to a UV mask-aligner.

4. The method of claim 3, wherein the photoresist is exposed to the direct laser writer at a wavelength of 375 nm.

5. The method of claim 3, wherein the photoresist is exposed to the UV mask-aligner with a dose of 400 mJ/cm2.

6. The method of claim 1, wherein the thin film comprises at least one of molybdenum-doped indium oxide, vanadium oxide, tungsten trioxide, or silver.

7. The method of claim 1, wherein the substrate comprises at least one of Si, $SiO_2$, $HfO_2$, or $TiO_2$.

8. The method of claim 1, wherein the thin film has a thickness of less than 100 nm.

9. The method of claim 1, wherein the photoresist comprises at least one of novolak resin or naphthoquinone dyazide photoactive compound.

10. The method of claim 1, wherein the exposing of the portion of the photoresist comprises heating the photoresist to above 110° C.

11. A method comprising:
    defining, with a first lithography, a pattern shape in a photoresist positioned on a substrate;
    removing the pattern of the photoresist, the removing leaving a layer of carbon residue in the pattern shape;
    depositing a thin film on the layer of carbon residue;
    spalling of the thin film around a periphery of the pattern, the spalling generating 3D nanowalls along the periphery of the pattern.

12. The method of claim 11, wherein a thickness of the 3D nanowalls is the same as a thickness of the thin film.

13. The method of claim 12, wherein the thickness of the thin film is between 100 nm and 20 nm.

14. The method of claim 11, wherein the 3D nanowalls comprises at least one of $WO_3$ or $VO_2$.

15. The method of claim 11, wherein defining the pattern comprises:
    spin coating the substrate with the photoresist;
    heating the photoresist to a temperature above 110° C.; and
    exposing the photoresist to UV light.

16. The method of claim 11, further comprising reversing the pattern, the reversing comprising:
    heating the photoresist a temperature above 130° C.; and
    exposing the photoresist to a UV mask aligner.

17. The method of claim 11, wherein the removing of the pattern comprises removing the photoresist with $O_2$ plasma.

* * * * *